United States Patent
Lee et al.

(10) Patent No.: US 7,902,558 B2
(45) Date of Patent: Mar. 8, 2011

(54) SUBSTRATE OF LIQUID CRYSTAL DEVICE AND METHOD FOR MANUFACTURING THE SAME

(75) Inventors: Yi-Wei Lee, Hsin-Chu (TW); Ching-Yun Chu, Hsin-Chu (TW)

(73) Assignee: AU Optronics Corporation, Hsinchu (TW)

( * ) Notice: Subject to any disclaimer, the term of this patent is extended or adjusted under 35 U.S.C. 154(b) by 177 days.

(21) Appl. No.: 12/453,256

(22) Filed: May 5, 2009

(65) Prior Publication Data
US 2009/0212302 A1    Aug. 27, 2009

Related U.S. Application Data

(62) Division of application No. 11/797,783, filed on May 8, 2007, now Pat. No. 7,544,528.

(30) Foreign Application Priority Data

Jul. 3, 2006   (TW) ................................ 95124157 A (51) Int. Cl.
  *H01L 29/786* (2006.01)
(52) U.S. Cl. .................... 257/79; 257/E29.299; 349/148
(58) Field of Classification Search ............. 257/79, 257/E29.299; 349/148
  See application file for complete search history.

(56) References Cited

U.S. PATENT DOCUMENTS

| 7,544,528 B2 * | 6/2009 | Lee et al. ................ 438/30 |
| 2002/0182785 A1 | 12/2002 | Miyairi |
| 2008/0001232 A1 | 1/2008 | Lee et al. |
| 2008/0224144 A1 * | 9/2008 | Ting .................. 257/59 |

FOREIGN PATENT DOCUMENTS

| CN | 1388406 | 1/2003 |
| CN | 1832220 | 9/2006 |
| JP | 5029345 | 2/1993 |
| JP | 6163586 | 6/1994 |
| JP | 9260668 | 10/1997 |
| JP | 2005210081 | 8/2005 |
| KR | 10-2004-0061450 A | 7/2004 |

* cited by examiner

*Primary Examiner* — George Fourson
(74) *Attorney, Agent, or Firm* — Bacon & Thomas, PLLC (57) ABSTRACT

A method for manufacturing a substrate of a liquid crystal display device is disclosed. The method includes forming a conductive line structure with low resistance to improve the difficulty of the resistance matching. The method can effectively reduce the resistance of the conductive line of the LCD panel to increase the transmission rate of the driving signal. Hence, the increasing yield of products can reduce the cost of manufacturing, and can meet the requirement of the large-size and high-definition thin film transistor liquid crystal display device.

4 Claims, 8 Drawing Sheets

SUBSTRATE OF LIQUID CRYSTAL DEVICE AND METHOD FOR MANUFACTURING THE SAME

This application is a Divisional of application Ser. No. 11/797,783 filed on May 8, 2007, the entire disclosure of which is herein incorporated by reference.

BACKGROUND OF THE INVENTION

1. Field of the Invention

The present invention relates to a method for manufacturing a substrate of liquid crystal display (LCD) devices, and more particularly to a method for manufacturing a substrate of thin film transistor (TFT) LCD devices.

2. Description of Related Art

Currently, manufacturers of integrated circuits have progressed to the stage of ultralarge scale integration (ULSI). Because of cost of manufactured integrated circuits and driving rate of elements, manufacturers of back-end metal lines have a tendency to produce multilayers and fine metal lines. A first problem experienced by the manufacturers of metal conductive line fining is a capacity effect, which reduces signal-transmitting rate, produced from insulation layers between metal layers.

The transmitting rate of circuit signals is determined by product of resistance (R) and capacity (C), and the smaller RC product means the faster transmitting rate. In traditional methods for solving signal delay of internal metal conductive lines, metal with lower resistance is commonly used to make metal conductive lines, or insulating material with lower dielectric constant is used to make insulation layers between metal layers. These methods do cause the signal-transmitting rate of conductive lines to be improved.

Comparing to conventional CRT monitors, LCD devices have advantages of low consumption of electricity, compact size, and no radiation. While contemporary requirements of TFT LCD devices have a tendency to large panel size and high image resolution, RC delay in signal-transmitting rate of metal conductive lines is in fact more critical. In order to improve transmitting rate of signals driven by TFTs, metals with low resistance for example, copper, silver, gold etc. are applied to make metal lines or gate electrodes of substrates of flat panel display devices. Therefore, the problem of driving signal delay can be solved.

SUMMARY OF THE INVENTION

The present invention is to form the conductive line structure having low electric resistance to improve conventional panels, which have a problem of unmatched resistant values. Therefore, the transmitting rate of signals driven by the TFT is faster to meet the tendency toward to large panel size and high image quality for a colorful flat panel display device nowadays.

This invention provides a method for manufacturing a substrate of an LCD device, further comprising the following steps: (a) providing a substrate; (b) forming a patterned first insulation layer on the surface of the substrate, wherein the patterned first insulation layer has plural notches; (c) forming a buffer layer to cover the surfaces of the first insulation layer and the notches; (d) patterning the buffer layer to remain a patterned buffer layer on the surface of the notches by lithography; (e) depositing a first metal layer to form a source and a drain respectively in the notches of the first insulation layer; (f) forming a patterned semi-conductive layer on the first insulation layer, being contacted with the source and the drain; (g) forming a second insulation layer on the surface of the patterned semi-conductive layer, and (i) patterning a patterned second metal on the patterned semi-conductive layer.

In order to protect the TFT surface from oxidation due to the environment or effects of the subsequent manufacturing steps, the method for manufacturing the substrate of the LCD device further comprises a step (i), forming a patterned protective layer to cover the surface of the second metal layer.

A substrate of a liquid crystal display device of the present invention comprising: a substrate; a patterned first insulation layer having plural notches formed on the surface of the substrate; a patterned buffer layer formed on the surface of the first insulation layer and the surface of the notches, wherein the notches filled with a first metal layer to form a source and a drain respectively; a patterned semi-conductive layer contacted with the source and the drain on the first insulation layer; a second insulation layer formed on the surface of the semi-conductive layer; and a second metal layer on the second insulation layer.

Material of the first metal layer illustrated in the present invention is a metal material having low electric resistivity, and preferably is copper, silver, gold, or a combination thereof, and more preferably is copper, to apply a metal conductive line with low electric resistance. Therefore, the TFT manufactured in the present invention can solve the problem of driving signals delayed in the conventional TFT, and meet the requirements of large panel size and high image quality for a colorful flat panel display device.

In the TFT manufactured in the present invention, the buffer layer is applied mainly to avoid alkali ions of the substrate diffusing to the source and the drain of the TFT, and copper ions of the source and the drain diffusing to the substrate or the first insulation layer. The material of the buffer layer is preferred to be, but not limited to, silica ($SiO_x$), silicone nitride ($SiN_x$), titanium nitride ($TiN_x$), tantalum nitride (TaN), or a combination thereof. Further, the proper material choice of the buffer layer depends on the requirement of the following layer preparation. The buffer layer can efficiently control the sheet resistance of the first metal layer, which can control the sheet resistance of the source and the drain made of copper to be within the proper range. Furthermore, the thickness of the buffer layer is preferred to be, but not limited to, the range of 500 to 1000 Å.

After a step (e) forming a source and a drain in the method for manufacturing the substrate of the LCD device in the present invention, the surfaces of the source and the drain are selectively annealed to form a barrier layer thereon. The material of the barrier layer is preferably, but not limited to, copper silicon compound that decrease the contact resistance of the source and drain surfaces. Further, the thickness of the barrier layer is preferred to be, but not limited to, in the range of 150 to 600 Å.

In a preferable embodiment, in order to form the barrier layer, plasma enhanced chemical vapor deposition is utilized in the condition of filling with $SiH_4$ gas to anneal the first metal layer surface at 350° C., which forms a copper silicon compound (CuSix) to be the barrier of the present invention.

In the method of the present invention, ionic dopants are selectively implanted into the semi-conductive layer manufactured therein to form an N-type or P-type semi-conductive layer. Therefore, after the step (g), the method selectively further includes a step (g1): implanting ionic dopants into the semi-conductive layer to form an N-type or P-type semi-conductive layer. Further, the ionic dopants used in the present invention are not limited. So, N-type or P-type ions are implanted into the TFT manufactured in the present invention if it is necessary to the products. In a preferable embodiment, the ionic dopant is a dopant with boron ions implanted into the semi-conductive layer to form a P-type semi-conductive layer. In another preferred embodiment, the ionic dopant is a dopant with phosphorous ions implanted into the semi-conductive layer to form an N-type semi-conductive layer.

The proper materials of the semi-conductive layer can be a conventional material of the semi-conductive layer, and preferably are amorphous silicon materials, or polycrystalline silicon materials. Further, the thickness of the semi-conductive layer is preferably, but not limited to, in the range of 500 to 4000 Å, and the structure of the semi-conductive layer can be the structure of single or multilayers.

In another preferred embodiment of the present invention, the formation of the patterned semi-conductive layer in the step (f) includes the following steps: first, depositing an amorphous silicon layer on the first metal layer surface; then, crystallizing the amorphous silicon layer to transform into a polycrystalline silicon layer; finally, patterning the polycrystalline silicon layer by way of lithography. Therefore, the TFT having the polycrystalline silicon layer manufactured in the present invention can not only increase the stability of the products, but also improve the electrical quality of the elemental switches.

The step, illustrated above in the present invention, transforming the amorphous silicon layer into the polycrystalline silicon layer can be any conventional preparation thereof, and preferably is by way of excimer laser crystallization, or metal induced lateral crystallization to transform the amorphous silicon layer into the polycrystalline silicon layer.

In order to form a pixel area on the substrate of the LCD device, the method of the present invention, between the step (e) and the step (f), further comprises a step (e1): on the first insulation layer, forming a patterned transparent conductive layer contacting with the drain. Therefore, the second insulation layer could be a patterned second insulation layer to expose the transparent conductive layer, which is a pixel area on the substrate of the LCD device in the present invention.

In the step (e) of the method, the formed source and drain surfaces preferably have the same height as the first insulation surface. In a preferred embodiment, the step (e) by way of electroplating is processed to deposit the first metal layer on the surfaces of the first insulation and the notches. Through chemically mechanical grinding and wet etching, the first insulation layer and the first metal layer are planarized to form the source and drain.

The plating step to deposit the first metal layer on the substrate is through an electroplating or electrolessplating process, preferably through an electrolessplating manufacture, and further preferably through a manufacture of chemical plating or auto catalytic plating. Before depositing the first metal layer through plating, a seed layer is deposited if it is necessary, and the thickness of the seed layer is not limited. Further, the thickness of the first metal layer is preferably, but not limited to, in the range of 1500 to 4000 Å.

The material of the first insulation is preferably, but not limited to, to a transparent material. The thickness of the first insulation of the present invention is not limited to, but preferably is in the range from 500 to 2000 Å.

The method for manufacturing the substrate of the LCD device is processed to manufacture not only a top-gate TFT, but also a terminal area, a capacitance area, a scanning line area, a data line area, and a pixel area on the surface of the substrate, if it is necessary to be manufactured, to apply a complete substrate of the TFT LCD device.

The steps for forming layers of the TFT could be any conventional procedure thereof, and preferably physic vapor deposition (PVD) (e.g. ionized metal plasma of PVD (IMP-PVD)), chemical vapor deposition (e.g. plasma enhanced chemical vapor deposition and thermo-chemical vapor deposition), evaporation (e.g. metal evaporation), sputtering (e.g. long throw sputtering and collimator sputtering), or plating (e.g. electrolessplating of the wet manufacture and electroplating).

The flat panel substrate in the method for manufacturing the substrate of the LCD device is preferably a silicon one, a glass one, or a plastic one, and more preferably is a suitable one utilized for the active array matrix flat panel, for example, but not limited to, silicon glass without dopants, phosphorous doped glass, boron-phosphorous doped glass, sodium-lime glass, borosilicate glass, sodium borosilicate glass, alkali metal borosilicate glass, aluminum silicate glass, aluminum-borosilicate glass, alkaline earth metal aluminum-borosilicate glass, or a combination thereof.

The proper material used in the second insulation layer and the protective layer of the manufactured TFT could be any insulating material, but is preferred to be organic materials, inorganic materials, or a combination thereof, and is more preferred to be silicon nitride ($SiN_x$), silica ($SiO_x$), silicon oxynitride ($SiO_xN_y$), or a combination thereof. Further, the thickness of the second insulation is not limited to, but preferred to be in the range from 1500 to 4000 Å.

The material of the transparent electrode layer can be any transparent and conductive material, but is preferred to be indium tin oxide (ITO), indium zinc oxide (IZO), or indium tin zinc oxide (ITZO). The thickness of the transparent electrode layer is preferably, but not limited to, from 500 to 3000 Å.

The material of the second metal layer, which is used for the gate electrode of the TFT manufactured in the present invention is not limited to, but preferably is aluminum, tungsten, chromium, copper, silver, gold, titanium, titanium nitride, aluminum alloy, chromium alloy, molybdenum, or a combination thereof. The thickness of the second metal layer used for the gate electrode is not limited to, but preferably is from 1000 to 3000 Å. Further, the structure of the second metal layer can be a single layer or multilayer structure. In the preferable embodiment, the second metal layer is a multilayer structure of TiN/Al—Cu alloy/Ti or TiN/Al—Si—Cu alloy/Ti.

Therefore, the substrate used for the LCD device manufactured in the present invention is applied for efficiently decreasing the resistant value of the conductive line in the panel. For this reason, not only the yield of the product is increased to effectively reduce the manufacture cost, but also the requirements for large panel size and high image quality of the TFT LCD devices are satisfied.

Other objects, advantages, and novel features of the invention will become more apparent from the following detailed description when taken in conjunction with the accompanying drawings.

BRIEF DESCRIPTION OF THE DRAWINGS

FIGS. 1 (*a*) to 1 (*l*) are flowcharts for manufacturing a substrate of the LCD device in the embodiment 1 of the present invention.

FIGS. 2 (*a*) to 2 (*g*) are flowcharts for manufacturing a substrate of the LCD device in the embodiment 2 of the present invention.

FIGS. 3 (*a*) to 3 (*h*) are flowcharts for manufacturing a substrate of the LCD device in the embodiment 3 of the present invention.

FIGS. 4 (a) to 4 (h) are flowcharts for manufacturing a substrate of the LCD device in the embodiment 4 of the present invention.

DETAILED DESCRIPTION OF THE PREFERRED EMBODIMENT

Figure 1:
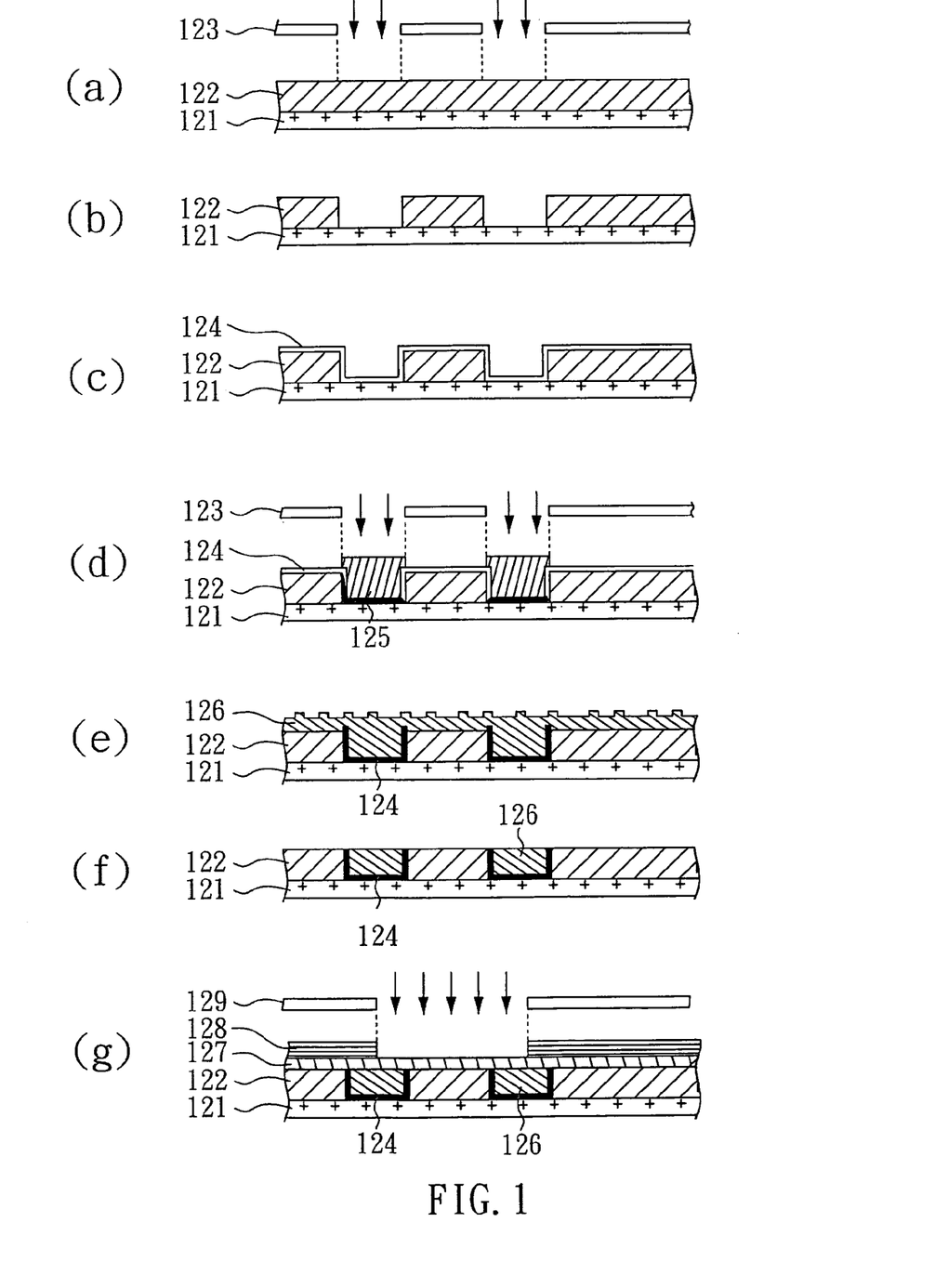

FIG. 1 (a) to FIG. 1 (l) show flow of manufacture wherein the present invention is a preferable embodiment of a method for manufacturing substrates of LCD devices. The manufactured substrate of the present invention is a type of TFT with top-gate electrodes. To reduce the quantity of masks and furthermore to abate costs, a positive or negative photoresist is used in the different steps.

As shown in FIG. 1 (a), a transparent glass substrate 121 is provided first. On the surface of the substrate 121, a first insulation layer 122 and positive photoresist (not shown in figures) are deposited. A first mask 123 is applied to pattern the first insulation layer 122 that is etched to form notches into which sources and drains are to be respectively inlaid. Thus, the structure of the substrate shown in FIG. 1 (b) is completed. Further, the first insulation layer 122 is a transparent layer, and thickness of thereof is about 500 to 2000 Å.

Subsequently, on the surface of the first insulation layer 122, titanium nitride (TiN) material is deposited to be a buffer layer 124 (see FIG. 1 (c)). A negative photoresist 125 is formed on the surface of the buffer layer 124, and then the buffer layer 124 is patterned using the first mask 123. The buffer layer is required to form only on the notch surface where each source/drain will be respectively inlaid. Finally, the negative photoresis 125 in the notch is removed. Further, the thickness of the patterned buffer layer 124 formed in the present embodiment is about 500 to 1000 Å.

The manufactured substrate illustrated above is then immersed in a copper seed solution to form a copper seed layer thereon (not shown in the figures). Subsequently, the substrate is immersed in a solution comprising copper sulfate, hydrochloric acid, sulfuric acid, a glazing agent, and a leveler, and then is conducted with an electric current to process autocatalytic plating reaction. Copper ions are reduced on the surface of the copper seed layer to form a first metal layer 126 in every notch. A structure of the substrate shown in FIG. 1 (e) is obtained. Preferably, the copper seed solution used to form the seed layer is mainly composed of a metal salt, a pH value conditioner, a surfactant, a wetter, an acidic catalyst etc. Adherent strength and uniformity between the first metal layer 126 and the buffer layer 124 are enhanced by the seed layer in the present embodiment.

In order to planarize the first metal layer 126, the surface of every source and drain formed as the first metal layer 126, and the surface of the first metal layer 122 are at the same height. Preferably, chemical mechanical grinding or wet etching is applied to planarize the first insulation layer 122 and the first metal layer 126.

In the present embodiment, wet etching is used to remove copper of the surface. Sulfate peroxide solution is used to be an etcher relative to different sizes of glass substrates respectively. Furthermore, the main compositions of the etcher in the present embodiment are hydrogen peroxide, 10% to 15% sulfuric acid, acetanilide, sodium phenol sulfonate, and sodium thiosulfate, the temperature of which is in the range of 40° C. to 50° C.

As shown in FIG. 1 (f), in the present embodiment, the first metal layer 126 formed in the notch is used for the source/drain of the TFT, and the source and the drain are not electrically contacted together. Preferably, the buffer layer 124 in the present embodiment is applied to avoid the copper ion of source and the drain diffusing into the substrate 121 or the first insulation layer 122, and simultaneously to avoid alkali metal ions in the substrate diffusing to the source and the drain of the TFT.

Hence, the source/drain in the present embodiment is an inlayed structure that is covered by the buffer layer 124. The way to form the first metal layer 126 is not limited in the illustration of the present embodiment. The manufacturing method of other semi-conductive layers, i.e. physical vapor deposition, is also used to deposit the first metal layer 126 in the notch of the insulation layer 122.

Subsequently, as shown in FIG. 1 (g), a transparent conductive layer 127 made of indium tin oxide, indium zinc oxide, or indium tin zinc oxide is deposited on the whole substrate surface to cover both the first metal layer 126 and the first insulation layer 122. Furthermore, a positive photoresist 128 is formed on the surface of the transparent conductive layer 127. Preferably, the thickness of the formed transparent conductive layer 127 in the present embodiment is about 500 to 3000 Å.

A second mask 129 is applied to pattern the transparent conductive layer 127 forming a pixel area on the substrate of the LCD device. Further, the patterned transparent conductive layer 127 in the present embodiment is in contact with the drain of the TFT to conduct electric signals of the TFT.

On the substrate surface, a semi-conductive layer 130 made of amorphous silicon (a-Si: H) is deposited totally (shown in FIG. 1(h)) to cover the first insulation layer 122 and the transparent conductive layer 127. A negative photoresist 131 is formed on the surface of the semi-conductive layer 130. Subsequently, the second mask 129 is applied to pattern the semi-conductive layer to form a channel region of the TFT. Further, the patterned semi-conductive layer 130 in the present embodiment is contacted with the source/drain of the TFT.

As shown in FIG. 1 (i), on the surfaces of the transparent conductive layer 127 and the patterned semi-conductive lay 130, a second insulation layer 133, a second metal layer 134, and a negative photoresist 136 are deposited in sequence. Then, the second metal layer 134 is patterned with a third mask 135. After removing the negative photoresist 136 and etching the substrate, the structure of the substrate is shown as FIG. 1 (j). Preferably, the thickness of the second insulation 133 made of silicon nitride in the present embodiment is 1500 to 4000 Å. The second metal layer 134 made of TiN/Al—Cu alloy/Ti is a structure with multilayers, and the thickness thereof is 1000 to 3000 Å.

Subsequently, as shown in FIG. 1 (k), a protective layer 138 made of silica is deposited on the surfaces of the second metal layer 134 and the second insulation layer 133. The second metal layer 134 covered with the deposited protective layer 138 is protected from oxidation by the environment and possible negative effects of the subsequent steps.

Then, a negative photoresist 137 is deposited, and a second mask 129 is applied again to pattern the protective layer 138 and the second insulation layer 133. After removing the photoresist and etching the substrate, the transparent conductive layer 127 is revealed on the substrate surface. Finally, a substrate of the TFT LCD device is completed as shown in FIG. 1 (l).

Embodiment 2

The method for manufacturing a substrate of the TFT LCD device in the present embodiment is the same as illustrated in the embodiment 1 except a barrier layer is formed on the surface of the TFT source and drain, and the buffer layer is made of silicon nitride (SiN). Other conditions and steps in the manufacture are the same as in the embodiment 1.

Figure 2:
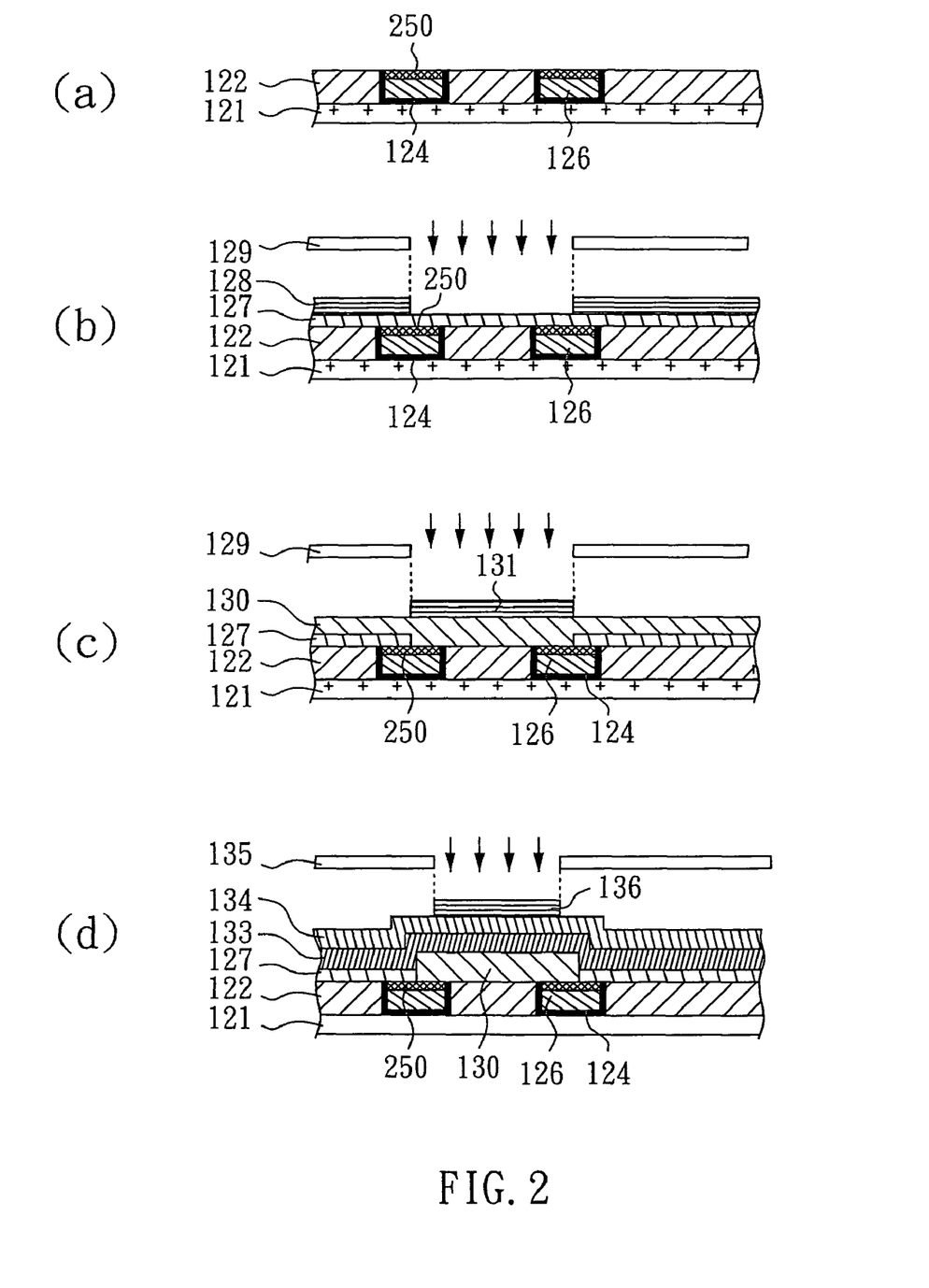

FIG. 2 (a) to FIG. 2 (g) are flowcharts of the preferable embodiment for manufacturing the substrate of the LCD device in the present invention.

FIG. 2 (a) shows that a substrate 121 is provided. A first metal layer 126 for the source and drain is formed according to the procedures shown in FIG. 1 (a) to FIG. 1 (f) in the embodiment 1.

Subsequently, by way of plasma enhanced chemical vapor deposition, the first metal layer is annealed in the condition of filled with $SiH_4$ gas at 350° C. On the surface of the first metal layer 126 made of copper, a copper silicon compound is formed to be a barrier layer 250 on the source/drain surface in the present embodiment. Furthermore, the barrier layer 250 is applied to reduce contacting electrical resistance of the source and drain surfaces. FIG. 2 (b) to FIG. 2 (g) show the subsequent layer procedures for manufacturing the substrate of the TFT LCD device, similar to the procedures illustrated in the embodiment 1.

Embodiment 3

The method for manufacturing a substrate of the TFT LCD device in the present embodiment is the same as illustration in the embodiment 1 and 2, except that the semi-conductive layer made of polycrystalline silicon is implanted ionic dopants in the polycrystalline silicon semi-conductive layer. Other conditions and steps in the manufacture are the same as in the embodiments 1 and 2.

Figure 3:
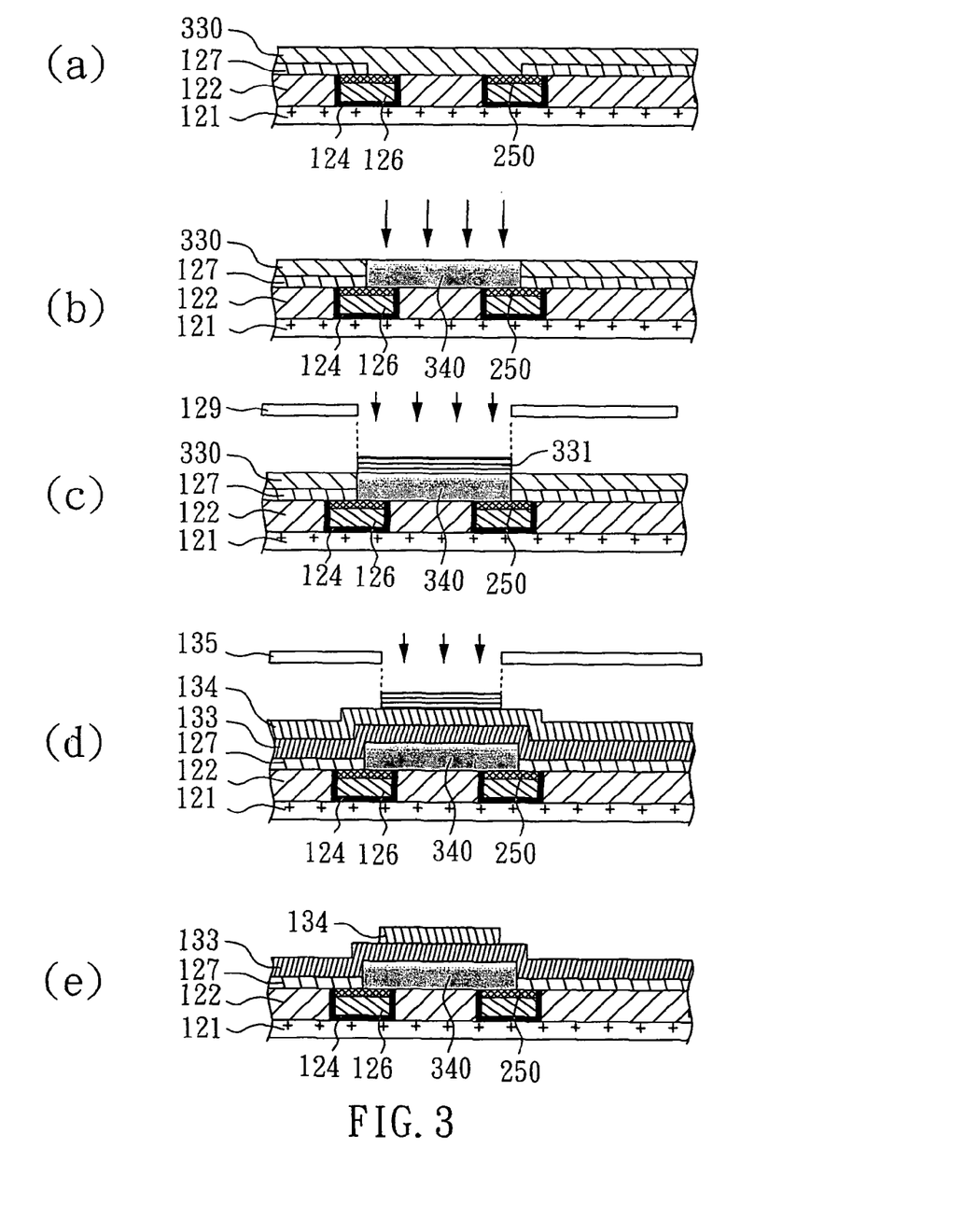

FIG. 3 (a) to FIG. 3 (h) are flowcharts of the preferable embodiment for manufacturing the substrate of the LCD device in the present invention.

As shown in FIG. 3 (a), a first metal layer 126 forming a source/drain on a substrate 121 is provided. The manufacturing steps of the first metal layer 126 are according to the flowchart shown in FIG. 1 (a) to FIG. 1 (f) of the embodiment 1. As illustrated in the embodiment 2 and shown in FIG. 2 (a), on the surface of the first metal layer 126, a copper silicon compound is formed to be a barrier layer 250. Subsequently, a patterned transparent conductive layer 127 is formed on the substrate 121.

After an amorphous silicon (a-Si:H) layer 330 is deposited on the surfaces of the first insulation layer 122 and the transparent conductive layer 127, the amorphous silicon layer 330 is annealed at 350° C. Part of the amorphous silicon layer 330 is induced to process lateral transformation through utilizing the barrier layer 250, and is transformed into a semi-conductive layer 340 composed of polycrystalline silicon. The structure of the substrate shown in FIG. 3 (b) is thus obtained.

A negative photoresist 331 is formed on the surfaces of the semi-conductive layer 340 and the amorphous silicon layer 330. Subsequently, the semi-conductive layer 340 is patterned to form a channel area of the TFT by employing a second mask 129 (see FIG. 3(c)). The steps that the second insulation layer 133 and the second metal layer 134 are formed with the third mask 135 to pattern the second metal layer 134 through shown from FIG. 3 (d) to FIG. 3 (e) are similar to illustration of the precedent embodiments. Preferably, the materials of the second metal layer are a copper aluminum alloy, or a copper silicon aluminum alloy. The copper aluminum alloy is applied in this embodiment.

As shown in FIG. 3 (f), utilizing the way of ion implantation with the pretilt angle about 35° to 60°, the ion of $B^+$ or $P^+$ is implanted into the semi-conductive layer 340 composed of polycrystalline silicon. Part of the channel area of the semi-conductive layer 340 is formed into a semi-conductive layer of doping ions (i.e. an ohmic contact area of the source/drain 341). Preferably, a dopant within $B^+$ is implanted into the semi-conductive layer to achieve a P-type of channel semi-conductive layer.

The following steps for manufacturing the complete substrate of the TFT LCD device are similar to the preceding embodiments (see FIGS. 3(g) to 3(h)). Further, the surface of the TFT is covered with a protective layer 138.

Embodiment 4

The method for manufacturing a substrate of the TFT LCD device in the present embodiment is the same as illustration in the embodiment 1, except that ionic dopants are implanted into the semi-conductive layer made of polycrystalline silicon. Other conditions and steps in the manufacture are the same as in the embodiment 1.

Figure 4:
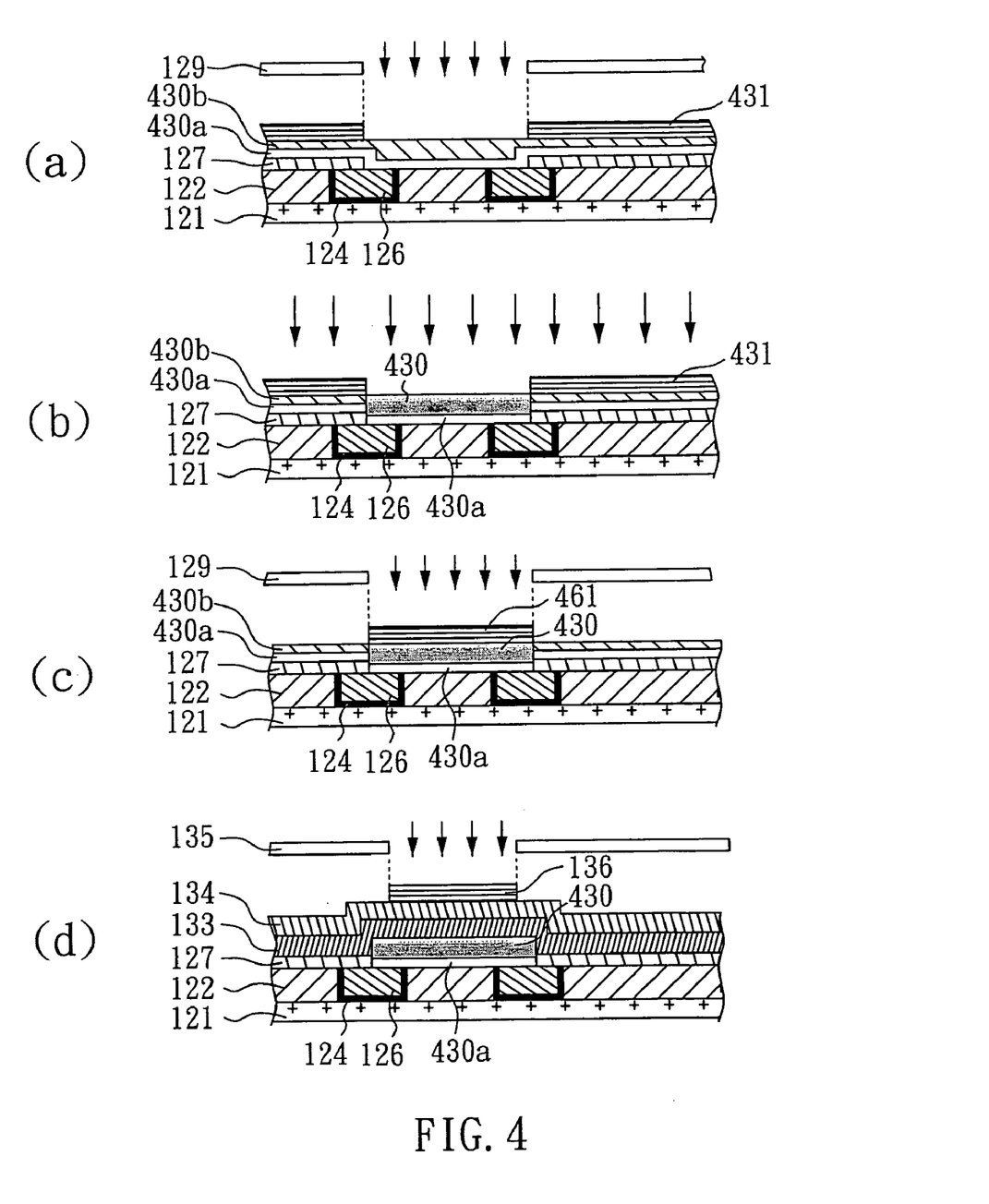

FIG. 4 (a) to FIG. 4 (h) are flowcharts of the preferred embodiment for manufacturing the substrate of the LCD device in the present invention. As shown in FIG. 4 (a), a substrate 121, on which a first metal layer 126 having the source/drain is formed, is provided. The manufacturing method of the substrate 121 is according to the flowchart of the embodiment 1 shown in FIG. 1 (a) to FIG. 1 (f). Subsequently, a patterned transparent conductive layer 127 is formed over the substrate 121.

An amorphous silicon layer made of SiN 430a and an a-Si:H amorphous silicon layer 430b, respectively covering the first insulation layer 122 and the transparent conductive layer 127, are deposited on the surface of the whole substrate 121 (see FIG. 4 (a)). A positive photoresist 431 is formed on the surface of the amorphous silicon layer 430b. Furthermore, the second mask 129 is utilized to pattern the positive photoresist 431, and the part surface of the amorphous silicon layer 430b is revealed through etching.

As shown in FIG. 4 (b), because of the SiN amorphous silicon layer deposited on the substrate 121 surface, the revealed part of the amorphous silicon layer 430b is transformed into a semi-conductive layer 430 composed of polycrystalline silicon through utilizing an excimer laser. Further, the positive photoresist 431 is removed.

A negative photoresist 461 covering the semi-conductive layer 430 composed of polycrystalline silicon and the amorphous silicon layer 430b is deposited over the surface of the whole substrate (see FIG. 4 (c)). The second mask 129 is applied again to define the channel area of the semi-conductive layer 430 of the TFT. Preferably, the semi-conductive channel area of the TFT in this embodiment is composed of the amorphous silicon layer 430a made of SiN, and the plural polycrystalline silicon semi-conductive layers 430.

In this embodiment, the following steps shown in FIG. 4 (d) to FIG. 4 (h) similar to the steps of the embodiment 3 shown in FIG. 3 (d) to FIG. 3 (h) are implemented to form the complete substrate of the TFT LCD device. Preferably, a dopant containing $P^+$ is implanted into the semi-conductive layer to form an N-type channel semi-conductive layer 430, and a protective layer 438 is coated on the surface of the TFT in this embodiment.

Therefore, not only the structure of the conductive line having the characteristic of low electrical resistance is achieved, but also the substrate of the TFT with the polycrystalline silicon semi-conductive layer is acquired in the present invention. All of these advantages are to enhance the stability of the products and electrical quality when the quantity of elemental switches is increased.

Although the present invention has been explained in relation to its preferred embodiment, it is to be understood that many other possible modifications and variations can be made without departing from the scope of the invention as hereinafter claimed.

What is claimed is:

1. A substrate of a liquid crystal display device, comprising:
   a substrate;
   a patterned first insulation layer having plural notches formed on the surface of the substrate;
   a patterned buffer layer formed on the surface of the first insulation layer and the surface of the notches, wherein the notches filled with a first metal layer to form a source and a drain respectively;
   a patterned semi-conductive layer contacted with the source and the drain on the first insulation layer, wherein ionic dopants may selectively implant into the semi-conductive layer to form an N-type or P-type semi-conductive layer; and
   a second insulation layer formed on the surface of the semi-conductive layer; and
   a second metal layer on the second insulation layer.

2. The substrate of a liquid crystal display device as claimed in claim 1, wherein the buffer layer comprises $SiO_x$, $SiN_x$, $TiN_x$, TaN, or a combination thereof.

3. The substrate of a liquid crystal display device as claimed in claim 1, further comprising a barrier layer formed on the surface of the source and drain.

4. The substrate of a liquid crystal display device as claimed in claim 3, wherein the barrier layer comprises a metal silicide.

* * * * *